United States Patent
Yamamoto (10) Patent No.: US 10,484,017 B2
(45) Date of Patent: Nov. 19, 2019

(54) DATA PROCESSING APPARATUS, AND DATA PROCESSING METHOD

(71) Applicant: Sony Corporation, Tokyo (JP)

(72) Inventor: Makiko Yamamoto, Tokyo (JP)

(73) Assignee: Sony Corporation, Tokyo (JP)

( * ) Notice: Subject to any disclaimer, the term of this patent is extended or adjusted under 35 U.S.C. 154(b) by 114 days.

(21) Appl. No.: 15/565,837

(22) PCT Filed: May 19, 2016

(86) PCT No.: PCT/JP2016/064833
§ 371 (c)(1),
(2) Date: Oct. 11, 2017

(87) PCT Pub. No.: WO2016/194623
PCT Pub. Date: Dec. 8, 2016

(65) Prior Publication Data
US 2018/0115324 A1 Apr. 26, 2018

(30) Foreign Application Priority Data

Jun. 1, 2015 (JP) ................. 2015-111294

(51) Int. Cl.
*H03M 13/27* (2006.01)
*H03M 13/11* (2006.01)
(Continued)

(52) U.S. Cl.
CPC ... *H03M 13/2792* (2013.01); *H03M 13/1145* (2013.01); *H03M 13/1165* (2013.01);
(Continued)

(58) Field of Classification Search
CPC ......... H03M 13/2792; H03M 13/1145; H03M 13/1165; H03M 13/255; H03M 13/271;
(Continued)

(56) References Cited

U.S. PATENT DOCUMENTS 9,032,260 B2 * 5/2015 Petrov ............... H03M 13/1165
714/701
9,059,829 B2 * 6/2015 Yamamoto ............ H04L 1/005
(Continued)

FOREIGN PATENT DOCUMENTS

JP 2013-168719 A 8/2013
WO 2015/045901 A1 4/2015

OTHER PUBLICATIONS

Mouhouche et al., Design of non uniform constellations for layered division multiplexing, 2015, IEEE International Symposium on Signal Processing and Information Technology (ISSPIT), pp. 247-251. (Year: 2015).*

(Continued)

*Primary Examiner* — John J Tabone, Jr.
(74) *Attorney, Agent, or Firm* — Michael Best & Friedrich LLP (57) ABSTRACT

A data processing apparatus and method with efficient decoding of an LDPC code under bit interleave processing is disclosed. In one example, a data processing apparatus includes a parallel demapping portion configured to obtain a second data stream by executing in parallel demapping processing corresponding to mapping on a transmission side for a first data stream as an object of processing. The apparatus also includes a bit interleave reverse processing portion configured to obtain a third data stream by executing in parallel bit interleave reverse processing corresponding to bit interleave on the transmission side for the second data stream, and an LDPC decoding portion configured to decode the third data stream which is inputted in parallel with a bit group as a unit. The present disclosure, for example, can be applied to a receiving apparatus for a digital broadcasting.

7 Claims, 9 Drawing Sheets

(51) Int. Cl.
*H04L 1/00* (2006.01)
*H03M 13/25* (2006.01)
*H03M 13/35* (2006.01)

(52) U.S. Cl.
CPC ......... *H03M 13/255* (2013.01); *H03M 13/27* (2013.01); *H03M 13/271* (2013.01); *H03M 13/2778* (2013.01); *H03M 13/356* (2013.01); *H04L 1/0043* (2013.01); *H04L 1/0058* (2013.01); *H04L 1/0071* (2013.01)

(58) Field of Classification Search
CPC ........... H03M 13/2778; H03M 13/356; H03M 13/27; H04L 1/0043; H04L 1/0058; H04L 1/0071
USPC ......................................... 714/776, 752, 786
See application file for complete search history.

(56) References Cited

U.S. PATENT DOCUMENTS

| | | | | |
|---|---|---|---|---|
| 9,319,072 | B2* | 4/2016 | Petrov | H03M 13/1142 |
| 9,484,993 | B2* | 11/2016 | Moon | H04B 7/0413 |
| 9,647,795 | B2* | 5/2017 | Ko | H03M 13/1165 |
| 2009/0245435 | A1* | 10/2009 | Challa | H03M 13/2957 375/341 |
| 2011/0145487 | A1* | 6/2011 | Haratsch | G11C 7/02 711/103 |
| 2013/0208836 | A1* | 8/2013 | Yamamoto | H04L 1/005 375/341 |
| 2014/0075271 | A1* | 3/2014 | Petrov | H03M 13/116 714/776 |
| 2014/0126674 | A1* | 5/2014 | Petrov | H03M 13/1165 375/340 |
| 2014/0129895 | A1* | 5/2014 | Petrov | H03M 13/1142 714/752 |
| 2015/0128012 | A1* | 5/2015 | Petrov | H03M 13/1165 714/776 |
| 2015/0333771 | A1* | 11/2015 | Petrov | H03M 13/1142 714/776 |

OTHER PUBLICATIONS

L. Zhang, "Channel Capacity Distribution of Layer-Division-Multiplexing System for Next Generation Digital Broadcasting Transmission," IEEE Xplore Digital Library/IEEE Spectrum, pp. 1-8, Beijing, Jun. 2014.

"Digital Video Broadcasting (DVB); Frame structure channel coding and modulation for a second generation digital terrestrial television broadcasting system (DVB-T2)," DVB-T.2: ETSI EN 302 755 V1.3.1, pp. 1-149 (Apr. 2012).

* cited by examiner

FIG.2

RELATED ART

FIG. 3

RELATED ART

DATA PROCESSING APPARATUS, AND DATA PROCESSING METHOD

TECHNICAL FIELD

The present disclosure relates to a data processing apparatus, and a data processing method, and more particularly to a data processing apparatus, and a data processing method in each of which an input to a low density parity check (LPDC) decoder for executing parallel processing at a predetermined bit width is optimized.

BACKGROUND ART

A Low Density Parity Check (LDPC) code as a kind of error-correcting code has a high error-correcting ability. In recent years, for example, the LDPC code has been widely adopted in a transmission system for a digital broadcasting, etc. such as Digital Video Broadcasting (DVB)-T.2, in Europe etc., DVB-S.2, and DVB-C.2, and Advanced Television System Committee (ATSC) 3.0 in USA, etc. (for example, refer to NPL 1).

Figure 1:
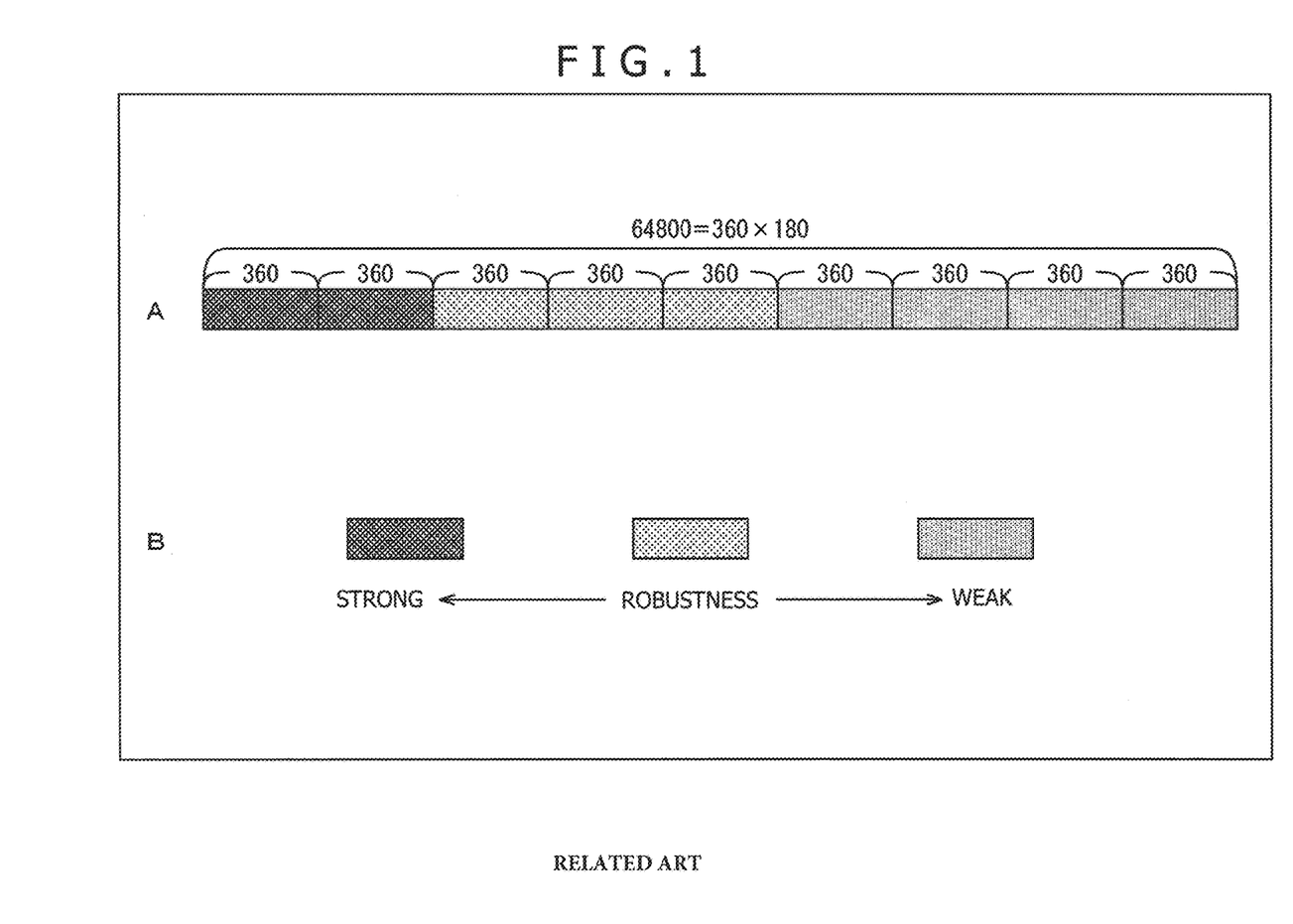
FIG. 1 is a diagram representing robustness when an LDPC code is transmitted is accordance with a 64K16QAM system.

FIG. 1 represents robustness in the case where 64,800 bits becoming a data unit of the LDPC code, for example, are transmitted in accordance with a 64K16 quadrature amplitude modulation (QAM) system. As depicted in the figure, 64,800 bits are structured by lining up 180 bit streams each having 360 bits, and the robustness differs with 360 bits as a unit.

Therefore, in transmitting the LDPC codes in accordance with the 64K16QAM system, bit interleave processing is executed in such a way that the robustness of the bit streams is dispersed.

Figure 2:
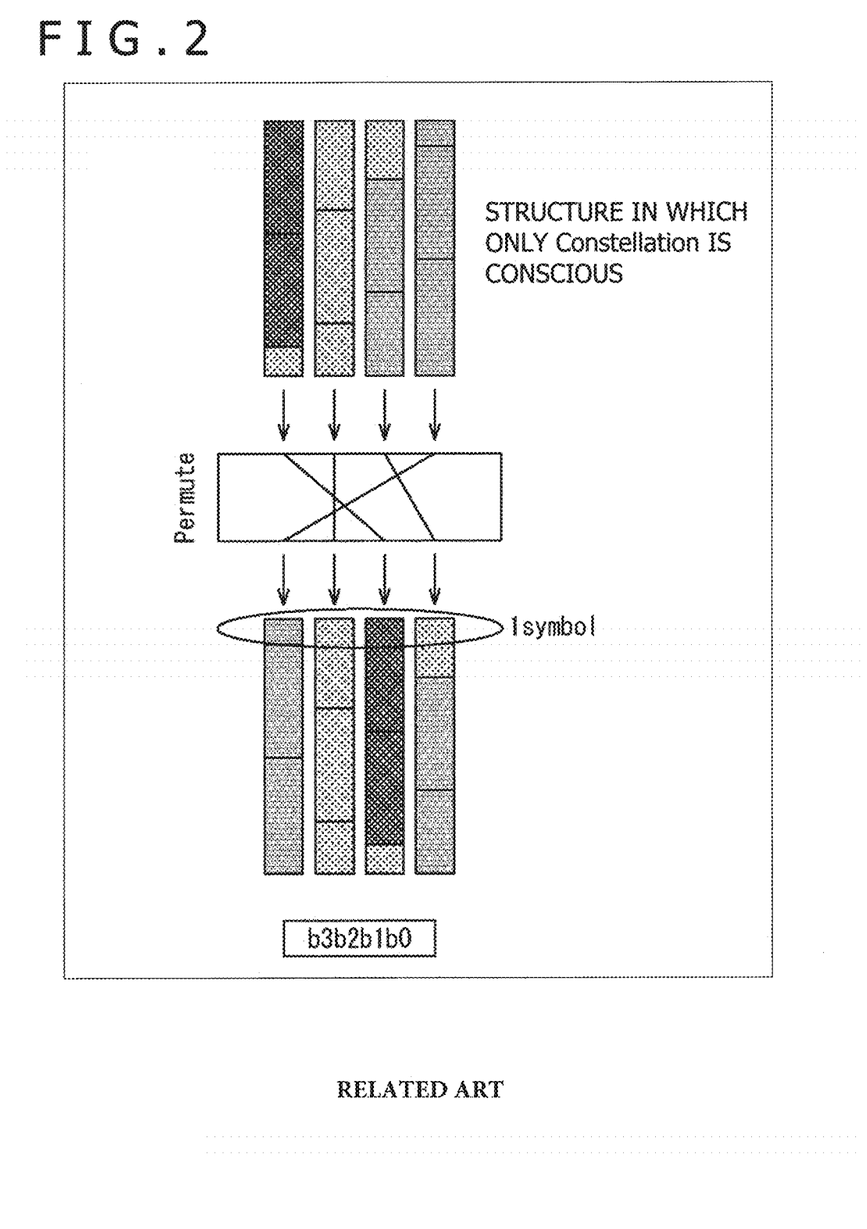
FIG. 2 is a diagram depicting a situation of past bit interleave processing.

FIG. 2 depicts a situation of the bit interleave processing which has heretofore been adopted in DVB-T.2, etc. As has been described above, in this interleaver (Permute), the interleave processing is executed with the aim of only the dispersion of the robustness.

Figure 3:
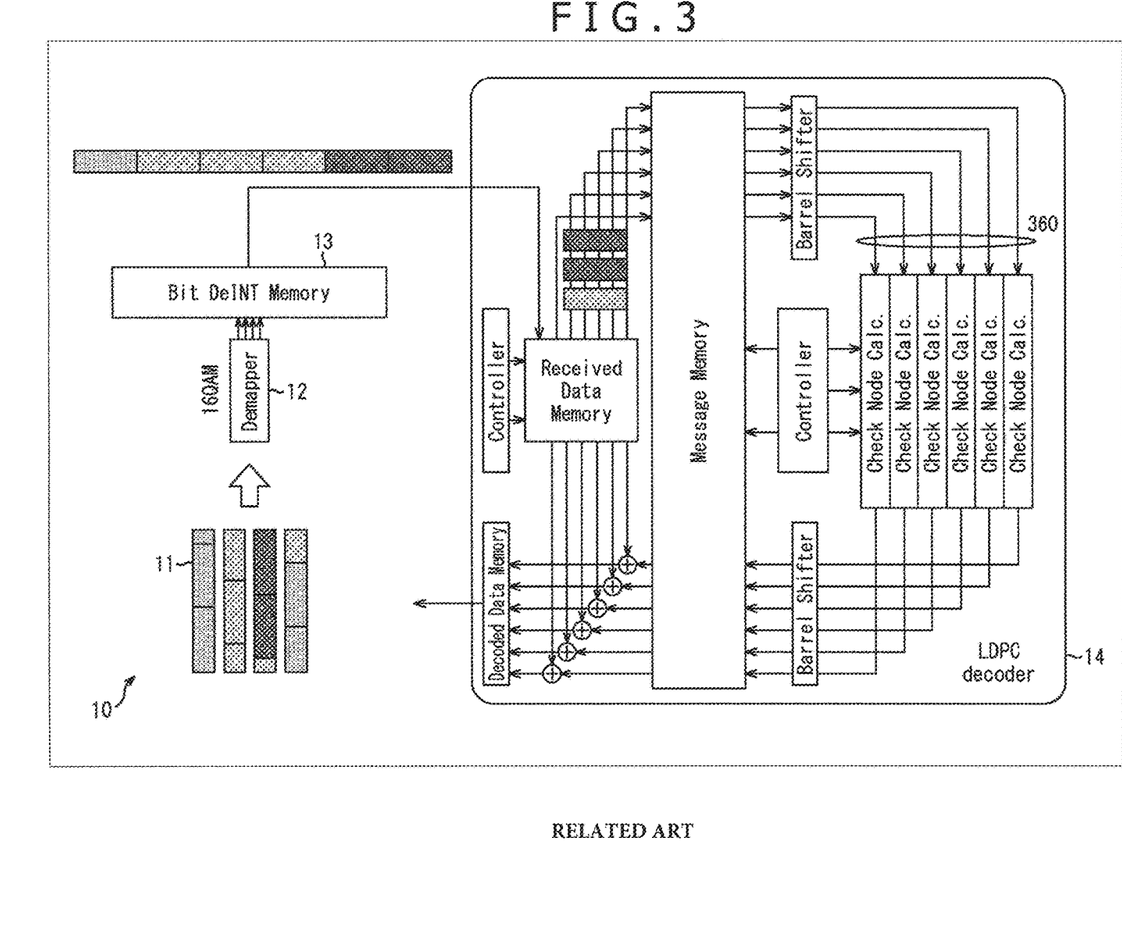
FIG. 3 is a block diagram depicting an example of a configuration of a past LDPC decoder and a configuration of a preceding stage of the past LDPC decoder.

FIG. 3 depicts an example of a configuration of an LDPC decoder for decoding the LDPC codes, which is adopted in a receiving apparatus for DVB-T.2, etc., and a configuration of a preceding stage of the LDPC decoder.

LDPC codes 11 which have been transmitted in accordance with the 64K16QAM system after transmission data was LDPC-coded on a transmission side, and the bit interleave processing was executed are inputted one symbol by one symbol (for 4 bits) to a demapper 12. The demapper 12 calculates a probability that each bit structuring one symbol is 0, and a probability that each bit structuring one symbol is 1 for each bit structuring one symbol.

A bit deinterleaver (Bit DeINT Memory) 13 executes bit deinterleave (reverse permutation sorting) processing for carrying out restoration of bit interleave (permutation sorting) processing executed on the transmission side.

An LDPC decoder 14 is configured in such a way that the data streams inputted in serial after the bit interleave reverse processing are converted in parallel so as for each of them to have a predetermined bit width (360 bits in case of the 64K16QAM system), and the original transmission data before the LDPC coding is then restored based on the probability of likelihood of 0 of each bit having the predetermined bit width, and the probability of likelihood of 1 of each bit having the predetermined bit width.

CITATION LIST

Non Patent Literature

[NPL 1]
  DVB-T.2: ETSI EN 302 755 V1.3.1 (2012-04)

SUMMARY

Technical Problem

As has been described above, the LDPC decoder provided on the reception side is configured in such a way that the parallel processing is executed with the predetermined bit width (360 bits in case of the 64K16QAM system) as the unit.

However, is case of the past configuration on the reception side, no serial processing is executed in the demapper 12 and the bit deinterleaver 13 in the preceding stage of the LDPC decoder 14. Therefore, the demapper 12 and the bit deinterleaver 13 became a bottleneck, which became a main cause for delaying time required until the LDPC codes can be restored.

The present disclosure has been made in the light of such a situation, and is adopted to efficiently restore LDPC codes for which bit interleave processing is being executed in consideration of not only dispersion of robustness, but also a processing unit of parallel processing in an LDPC decoder.

Solution to Problem

A data processing apparatus as a first aspect of the present disclosure is a data processing apparatus in which data as an object of transmission is LDPC-encoded on a transmission side, the resulting LDPC codes are mapped to a symbol on a complex plane corresponding to a predetermined modulation system, a data stream representing the symbol to which the mapping is carried out is bit-interleaved with a predetermined bit group as a unit, and the bit-interleaved data stream transmitted in accordance with the predetermined modulation system is made an object of processing. In this case, the data processing apparatus as the first aspect of the present disclosure includes: a parallel demapping portion, a bit interleave reverse processing portion; and an LDPC decoding portion. Here, the parallel demapping portion obtains a second data stream by executing in parallel demapping processing corresponding to the mapping on the transmission side for the first data stream, as an object of the processing, corresponding to the bit-interleaved data stream transmitted from the transmission side. The bit interleave reverse processing portion obtains a third data stream by executing in parallel bit interleave reverse processing corresponding to the bit interleave on the transmission side for the second data stream. In addition, the LDPC decoding portion decodes the third data stream which is inputted in parallel with the bit group as a unit.

The data processing apparatus as the first aspect of the present disclosure can further include a bit interleave processing portion. In this case, the bit interleave processing portion obtains a fourth data stream by executing in parallel the same bit interleave processing as that of the bit interleave on the transmission side for an output from the LDPC decoding portion. In addition, the parallel demapping portion can obtain a second data stream by executing in parallel a demapping processing corresponding to the mapping on the transmission side with the fourth data stream as well as the object of the processing.

A 64K16QAM system can be used as the above predetermined modulation system, and the above predetermined bit group unit can be set as 360 bits.

A data processing method as a first aspect of the present disclosure is a data processing method for use in a data processing apparatus in which data as an object of transmission on a transmission side is LDPC-coded on a transmission side, the resulting LDPC codes are mapped to a symbol on a complex plane corresponding to a predetermined modulation system, a data stream representing the symbol to which the mapping is carried out is bit-interleaved with a predetermined bit group as a unit, and the bit-interleaved data stream which has been transmitted in accordance with the predetermined modulation system is made an object of processing. In this case, the data processing method as the first aspect of the present disclosure includes: a parallel demapping step; a bit interleave reverse processing step; and an LDPC decode step which are executed by the above data processing apparatus. In this case, in the parallel demapping step, a second data stream is obtained by executing in parallel demapping processing corresponding to the mapping on the transmission side for a first data stream, as the object of the processing, corresponding to the bit-interleaved data stream transmitted from the transmission side. In the bit interleave reverse processing step, a third data stream is obtained by executing in parallel bit interleave reverse processing corresponding to the bit interleave on the transmission side for the second data stream. In addition, in the LDPC decoding step, the third data stream inputted in parallel with the bit group as a unit is decoded.

In one aspect of the present disclosure, the second data stream is obtained by executing in parallel the demapping processing corresponding to the mapping on the transmission side, for the first data stream with the processing as the object, corresponding to the bit-interleaved data stream transmitted from the transmission side. The third data stream is obtained by executing in parallel the bit interleave reverse processing corresponding to the bit interleave on the transmission side for the second data stream. In addition, the third data stream which is inputted in parallel with the bit group as a unit is LDPC-decoded.

A data processing apparatus as a second aspect of the present disclosure is a data processing apparatus in which a plurality of pieces of data as an object of transmission is respectively LDPC-coded on transmission side; and a received signal which is obtained through multiplexing in accordance with an LDM (Layered Division multiplexing) system after being bit-interleaved with a predetermined bit group as a unit is made an object of processing. In this case, the data processing apparatus includes: a parallel demapping processing portion; a bit interleave reverse processing portion; an LDPC decoding portion; and a bit interleave processing portion. The parallel demapping processing portion obtains a second data stream by executing in parallel demapping processing for calculating each likelihood of data as an object of decoding with data other than data as the object of decoding being regarded as a noise, for a first data stream as an object of processing, corresponding to the received signal transmitted from the transmission side. The bit interleave reverse processing portion obtains a third data stream by executing in parallel bit interleave reverse processing corresponding to the bit interleave on the transmission side for the second data stream. The LDPC decoding portion decodes the third data stream which is inputted in parallel with the bit group as a unit. In addition, the bit interleave processing portion obtains a fourth data stream by executing in parallel the same bit interleave processing as that of the bit interleave on the transmission side for an output from the LDPC decoding portion. In this case, the parallel demapping portion obtains a second data stream by executing in parallel the demapping processing with the fourth data stream as well as an object of processing.

With regard to the received signal, a first result and a second result can be multiplexed in accordance with the LDM system. In the first result, the first data as the object of the transmission is LDPC-coded on transmission side, bit-interleaved with the predetermined bit group as a unit, and modulated in accordance with the quadri-phase shift keying (QPSK) system. In the second result, the second data as the object of the transmission is LDPC-coded, interleaved with the predetermined bit group as a unit, and modulated in accordance with the 64 non-uniform constellation (NUC) system.

A data processing method as a second aspect of the present disclosure is a data processing method, for use in a data processing apparatus, in which a received signal which is multiplexed in accordance with an LDM (Layered Division Multiplexing) after a plurality of pieces of data set as an object of transmission is respectively LDPC-coded, and bit-interleaved with a predetermined bit group as a unit is set as an object of processing. The data processing method as the second aspect of the present disclosure includes: a parallel demapping processing step, a bit interleave processing step, an LDPC decoding step, and a bit interleave reverse processing step which are executed by a data processing apparatus. In this case, in the parallel demapping processing step, a second data stream is obtained by executing in parallel demapping processing for calculating each likelihood of data as an object of decoding with data other than data as the object of decoding being regarded as a noise for a first data stream as an object of processing corresponding to the received signal transmitted from the transmission side. In the bit interleave reverse processing step, a third data stream is obtained by executing in parallel bit interleave reverse processing corresponding to the bit interleave on the transmission side for the second data stream. In the LDPC decoding step, the third data stream which is inputted in parallel with the bit group as a unit is decoded. In addition, in the bit interleave processing step, a fourth data stream is obtained by executing in parallel the same bit interleave processing as that of the bit interleave on the transmission side for an output in the LDPC decoding step. In this case, in the parallel demapping step, a second data stream is obtained by executing in parallel the demapping processing.

In the second aspect of the present disclosure, the second data stream is obtained by executing in parallel the demapping processing for calculating each likelihood of the data as the object of decoding, with data other than data as the object of decoding, for the first data stream as the object of the processing, corresponding to the received signal transmitted from the transmission side. The third data stream is obtained by executing in parallel the bit interleave reverse processing corresponding to the bit interleave on the transmission side, for the second data stream. The fourth data stream is obtained by executing in parallel the same bit interleave processing as that of the bit interleave on the transmission side for an output through the decoding, the third data stream which is inputted in parallel with the bit group as a unit being decoded. In addition, the second data stream is obtained by executing in parallel the demapping processing with the fourth stream as well as the object of the processing.

Advantageous Effect of Invention

According to the first aspect of the present disclosure, the LDPC code can be efficiently decoded.

According to the second aspect of the present disclosure, even when the LDPC codes are multiplexed in accordance with the LDM system, the LDPC codes can be efficiently coded.

DESCRIPTION OF EMBODIMENTS

Hereinafter, the best modes for carrying out the present disclosure (hereinafter, referred to as an embodiment) will be described in detail with reference to the drawings.
<With Regard to Input Data Set as Object of Decoding Processing for Data Processing Apparatus as an Embodiment of the Present Disclosure>

Figure 4:
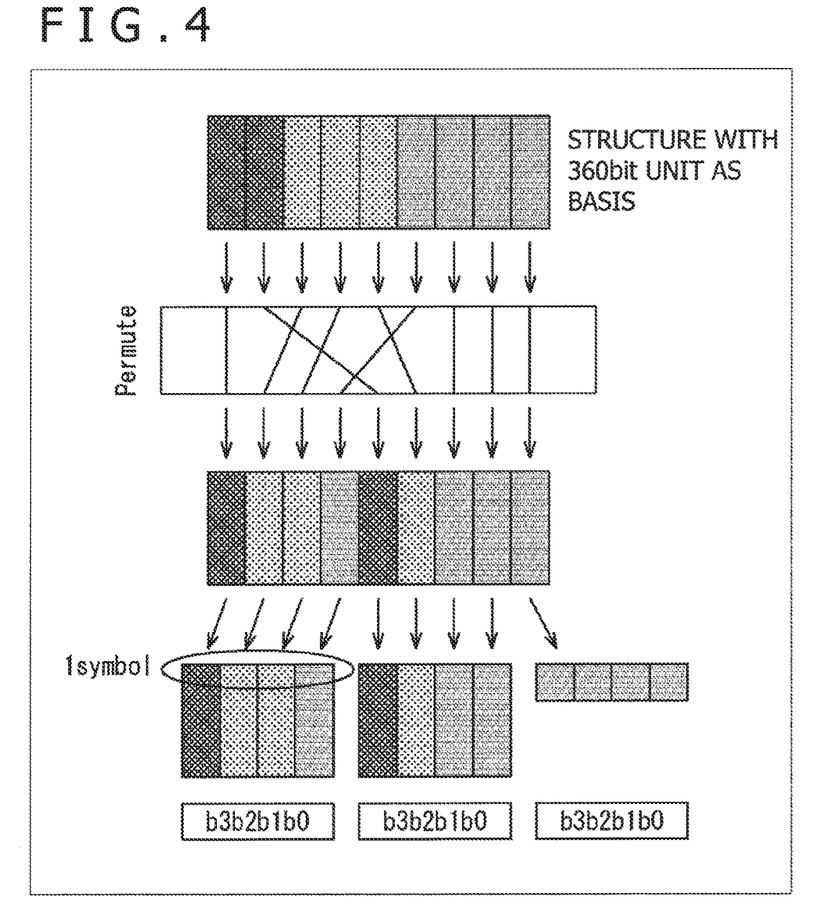
FIG. 4 is a diagram depicting a situation of bit interleave processing of a data stream as an object of processing for a data processing apparatus as an embodiment of the present disclosure.

FIG. 4 depicts a structure of bit interleave processing which is executed on a transmission side for an LDPC code as an object of decoding processing for the data processing apparatus as an embodiment of the present disclosure.

As depicted in the figure, for the LDPC code set as the object of the decoding processing for the data processing apparatus as the embodiment of the present disclosure, the bit interleave processing is executed in consideration of not only dispersion of robustness of a bit stream, but also 360 bits as a processing unit for parallel processing in an LDPC decoder.
<Example of Configuration of Data Processing Apparatus as Embodiment of the Present Disclosure>

Figure 5:
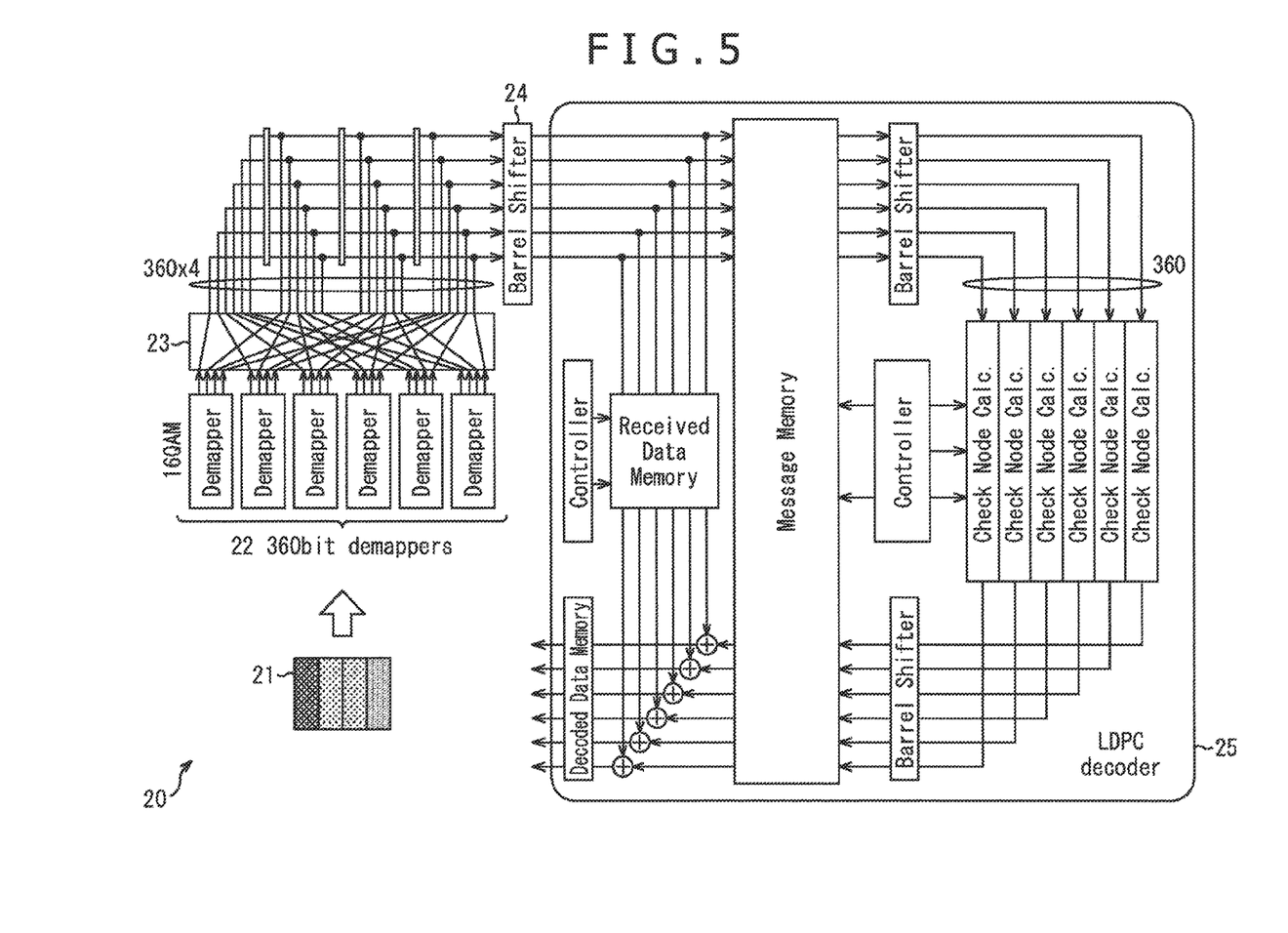
FIG. 5 is a block diagram depicting an example of a configuration of the data processing apparatus as the embodiment of the present disclosure.

Next, FIG. 5 depicts an example of a configuration of an LDPC decoder which the data processing apparatus as the embodiment of the present disclosure has, and a configuration of a preceding stage of the LDPC decoder.

A data processing apparatus 20 has 360 bit demappers 22, a bit deinterleaver 23, a barrel shifter 24, and an LDPC decoder 25.

The 360 bit demappers 22 are composed of a plurality of demappers for executing demapping processing, and executes parallel demapping processing. That is to say, each of the 360 bit demappers 22 calculates a probability that each bit of processing object data 21 inputted with 4×360 bits as a unit is 0, and a probability that each bit of processing object data 21 inputted with 4×360 bits as a unit is 1, and outputs the calculation result to the bit deinterleaver 23.

The bit deinterleaver 23 executes bit interleave reverse processing (reverse permutation) for carrying out restoration of bit interleave processing (permutation) executed on a transmission side. In addition, the bit deinterleaver 23 outputs successively the probabilities (the probability of likelihood of 0, and the probability of likelihood of 1) for four sets of bit interleave reverse processing 360 bits subjected to the bit interleave reverse processing to the barrel shifter 24.

The barrel shifter 24 executes column twist reverse processing corresponding to column twist processing which is being executed on the transmission side for the input. In the addition, the barrel shifter 24 outputs in parallel the probabilities for 360 bits after execution of the column twist reverse processing to the LDPC decoder 25.

The LDPC decoder 25 executes the LDPC decoding processing. That is to say, the LDPC decoder 25 restores the original transmission data before the LDPC coding based on the probability of likelihood of 0 of each bit for 360 bits inputted thereto in parallel, and the probability of likelihood of 1 of each bit for 360 bits.
<Operation of Data Processing Apparatus 20>

Figure 6:
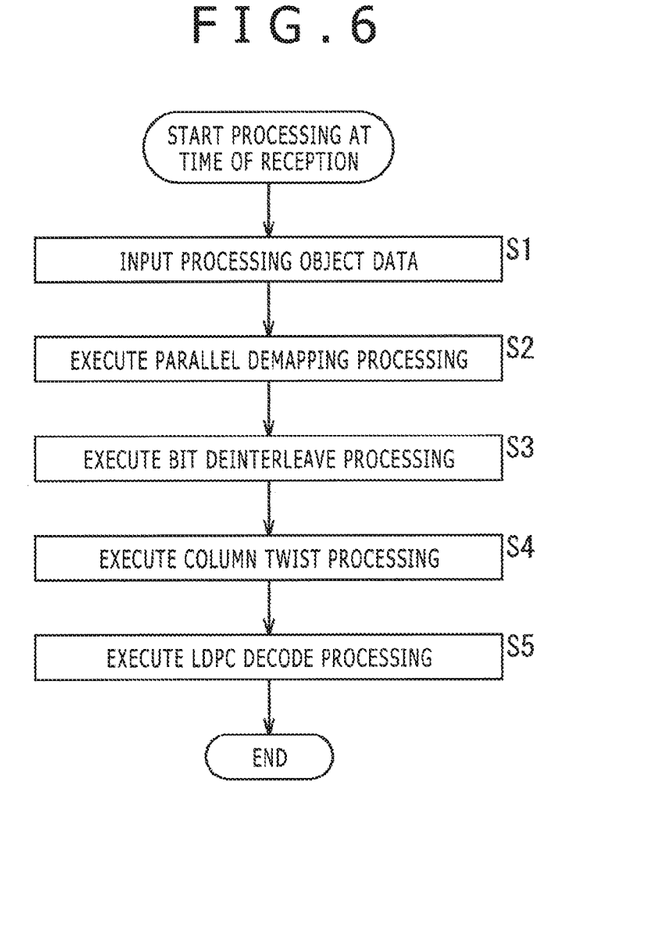
FIG. 6 is a flow chart explaining processing at the time of reception by the data processing apparatus of FIG. 5.

Next, FIG. 6 is a flow chart explaining processing at the time of reception by the data processing apparatus 20.

When the data processing apparatus 20 receives the LDPC code which is modulated in accordance with the 64K16QAM system from the transmission side, in Step S1, processing object data 21 is inputted with 4×360 bits as a unit to the 360 bit demappers 22. In Step S2, the 360 bit demappers 22 execute parallel demapping processing, and output in parallel the processing result, to the bit deinterleaver 23.

Next, in Step S3, the bit deinterleaver 23 executes bit interleave reverse processing, and outputs in parallel the processing results to the barrel shifter 24.

In Step S4, the barrel shifter 24 executes the column twist reverse processing for the parallel inputs, and outputs in parallel the processing results to the LDPC decoder 25. In Step S5, the LDPC decoder 25 executes the LDPC decoding processing. Above, the description of the processing at the time of reception by the data processing apparatus 20 has been ended.

As has been described so far, in the data processing apparatus 20, even in the preceding stage of the LDPC decoder 25, the demapping processing and the bit interleave reverse processing are executed in parallel to each other. Therefore, the data stream as the object of the processing can be inputted in parallel to the LDPC decoder 25 without delay. Therefore, as compared with the example of the past configuration depicted in FIG. 3, the result of decoding of the LDPC code can be more speedily obtained.
<Modified Change of Data Processing Apparatus as Embodiment of the Present Disclosure>

By the way, it has been known that the LDPC decoder, in terms of its characteristics, repetitively executes the LDPC decoding processing with its output being used as its input again, thereby enabling the decoding performance (the accuracy of the error correction) to be enhanced.

Figure 7:
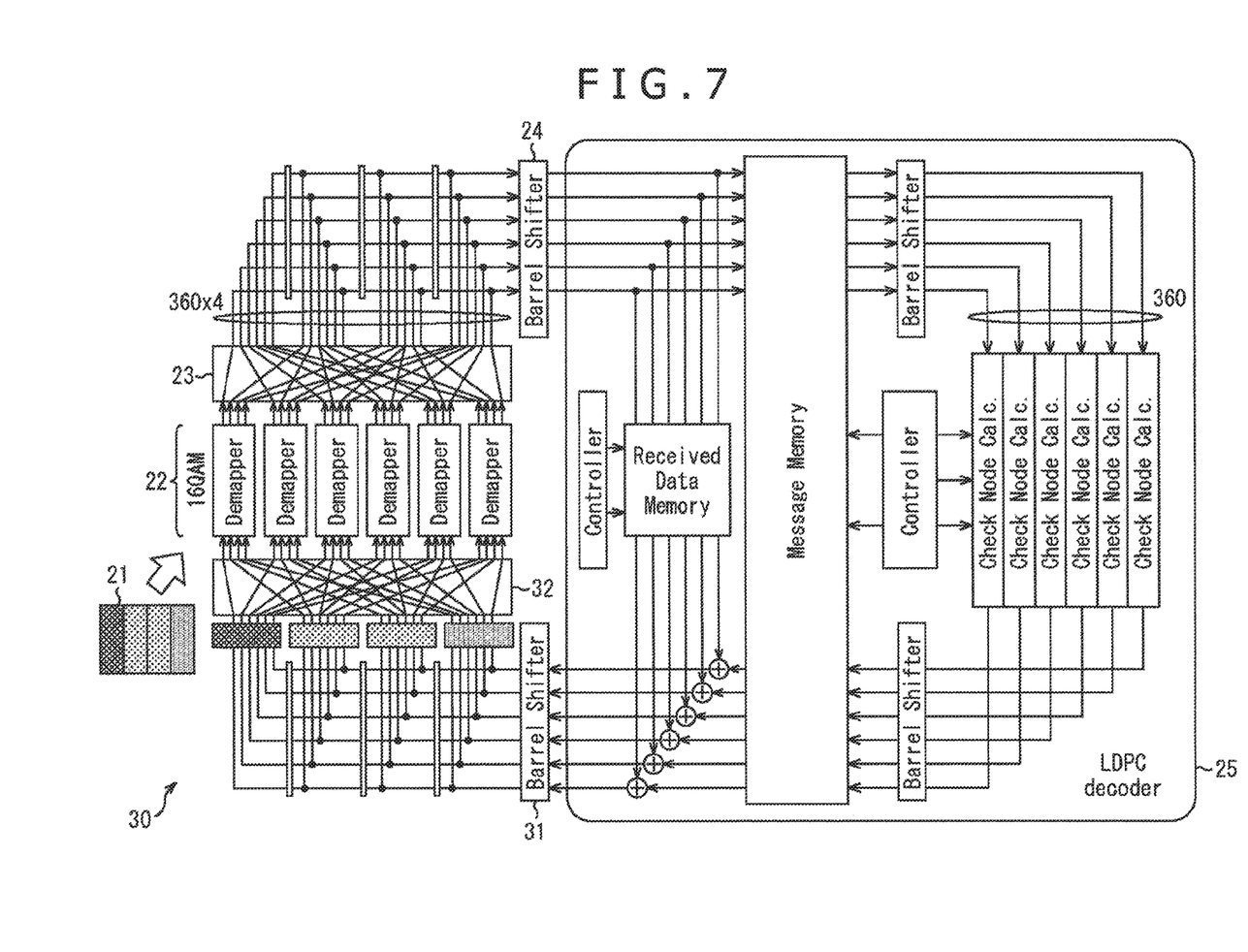
FIG. 7 is a block diagram depicting a modified change of the example of the configuration of the data processing apparatus as the embodiment of the present disclosure.

Next, FIG. 7 depicts a modified change of an example of a configuration of the LDPC decoder which the data processing apparatus as the embodiment of the present disclosure has, and the preceding stage of the LDPC decoder.

A data processing apparatus 30 as the modified change is designed to be adapted to repetitively execute the LDPC decoding processing. That is to say, the data processing apparatus 30 has a configuration in which a barrel shifter 31 and a bit interleaver 32 are added to a position corresponding to each of the subsequent stage of the LDPC decoder 25 of the data processing apparatus 20 depicted in FIG. 5 and the preceding stage of the 360 bit demapper 22.

The barrel shifter 31 executes the same column twist processing as the column twist processing executed on the transmission side for the outputs of the LDPC decoding processing, and outputs in parallel the processing results to the bit interleave 32.

The bit interleaver 32 executes the same bit interleave processing as the bit interleave processing which was executed for the LDPC codes on the transmission side, and outputs in parallel the processing results to the 360 bit demappers 22.

<Operation of Data Processing Apparatus 30>

Figure 8:
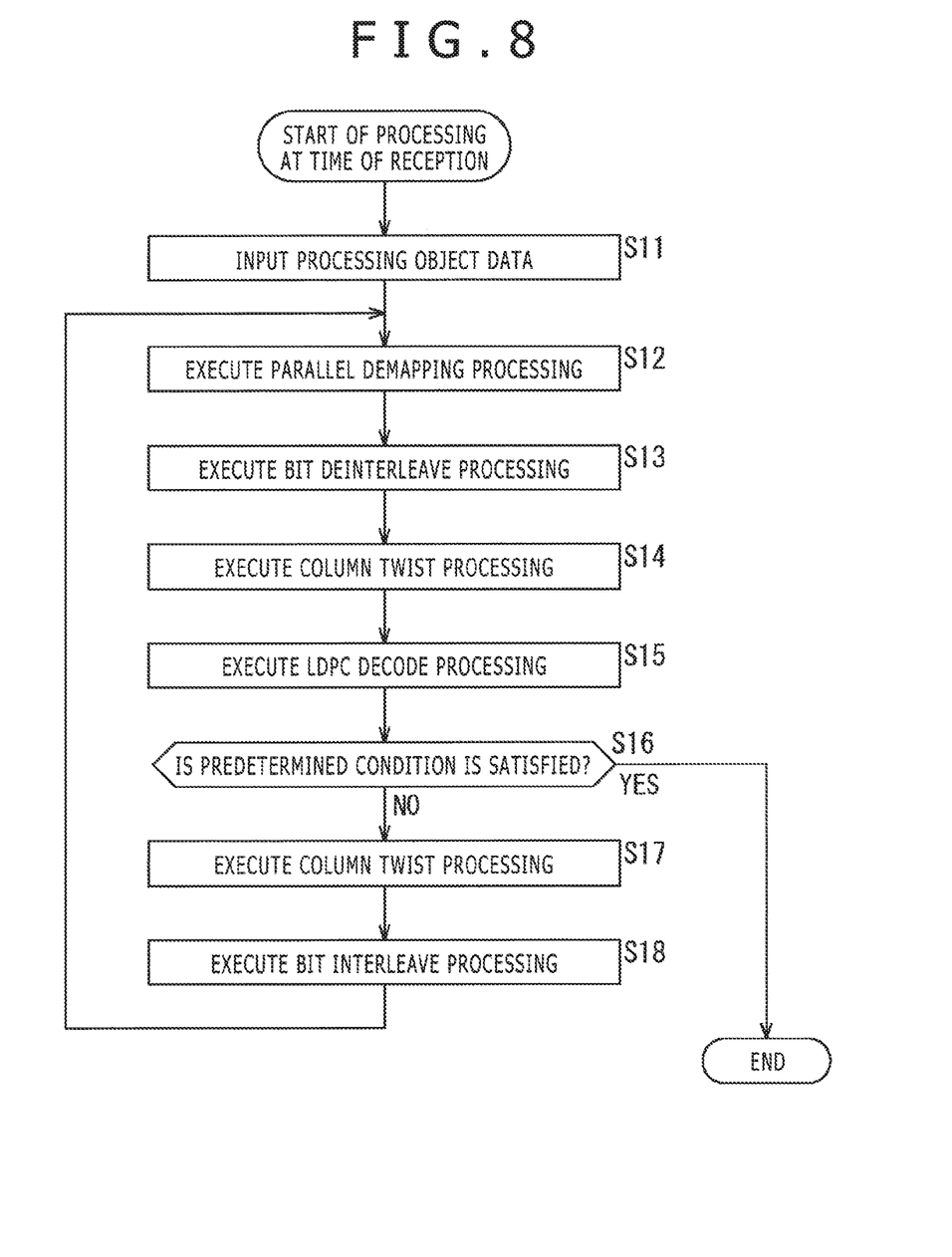
FIG. 8 is a flow chart explaining processing at the time of reception by the data processing apparatus of FIG. 7.

Next, FIG. 8 is a flow chart explaining the processing at the time of the reception by the data processing apparatus 30.

When the data processing apparatus 30 receives the LDPC codes which are modulated in accordance with the 64K16QAM system from the transmission side, in Step S11, the processing object data 21 is inputted to the 360 bit demappers 22 with 4×360 bits as a unit. In step S12, the 360 bit demappers 22 execute the parallel demapping processing, and output in parallel the processing results to the bit deinterleaver 23.

Next, in Step 13, the bit deinterleaver 23 executes the bit interleave reverse processing, and outputs in parallel the processing results to the barrel shifter 24.

In Step S14, the barrel shifter 24 executes the column twist reverse processing for the parallel input, and outputs in parallel the processing results to the LDPC decoder 25. In Step S15, the LDPC decoder 25 executes the LDPC decoding processing.

In Step S16, it is decided whether or not a predetermined condition for ending the processing at the time of the reception concerned is satisfied. As far as the predetermined condition, for example, the number of repetition of the LDPC decoding processing may be set, or a threshold value for accuracy of error correction for the LDPC decoding processing may be set.

When it is decided in Step S16 that the predetermined condition is not yet satisfied, the processing proceeds to Step S17. In Step S17, the barrel shifter 31 executes the same column twist processing as that on the transmission side for the parallel inputs from the LDPC decoder 25, and outputs in parallel the processing results to the bit interleaver 32.

In Step S18, the bit interleaver 32 executes the same bit interleave processing as that on the transmission side for the parallel inputs from the barrel shifter 31, and outputs in parallel the processing results to the 360 bit demapper 22. After that, the processing is returned back to Step S12, and the processing in and after the processing in Step S12 is repetitively executed.

Then, when it is decided in Step S16 that the predetermined condition is still satisfied, the processing at the time of the reception concerned is ended. Above, the description of the processing at the time of the reception executed by the data processing apparatus 30 has been ended.

As has been described so far, in the data processing apparatus 30, even in the preceding stage of the LDPC decoder 25, the demapping processing and the bit interleave reverse processing are processed in parallel to each other.

Therefore, the data streams as the object of the processing can be inputted in parallel to the LDPC decoder 25 without delay. In addition, since the LDPC decoding processing can be repetitively executed, the error correction can be carried out with higher accuracy.

<Example of Utilization of Data Processing Apparatus 30>

The data processing apparatus 30 as the modified change of the embodiment can decode the signal as well which is obtained through the multiplexing complying with the LDM (Layered Division Multiplexing).

It has been known that the LDM system is the technique for multiplexing a plurality of error correction code words in the electric power direction, and is effective in enhancing the transmission efficiency.

Figure 9:
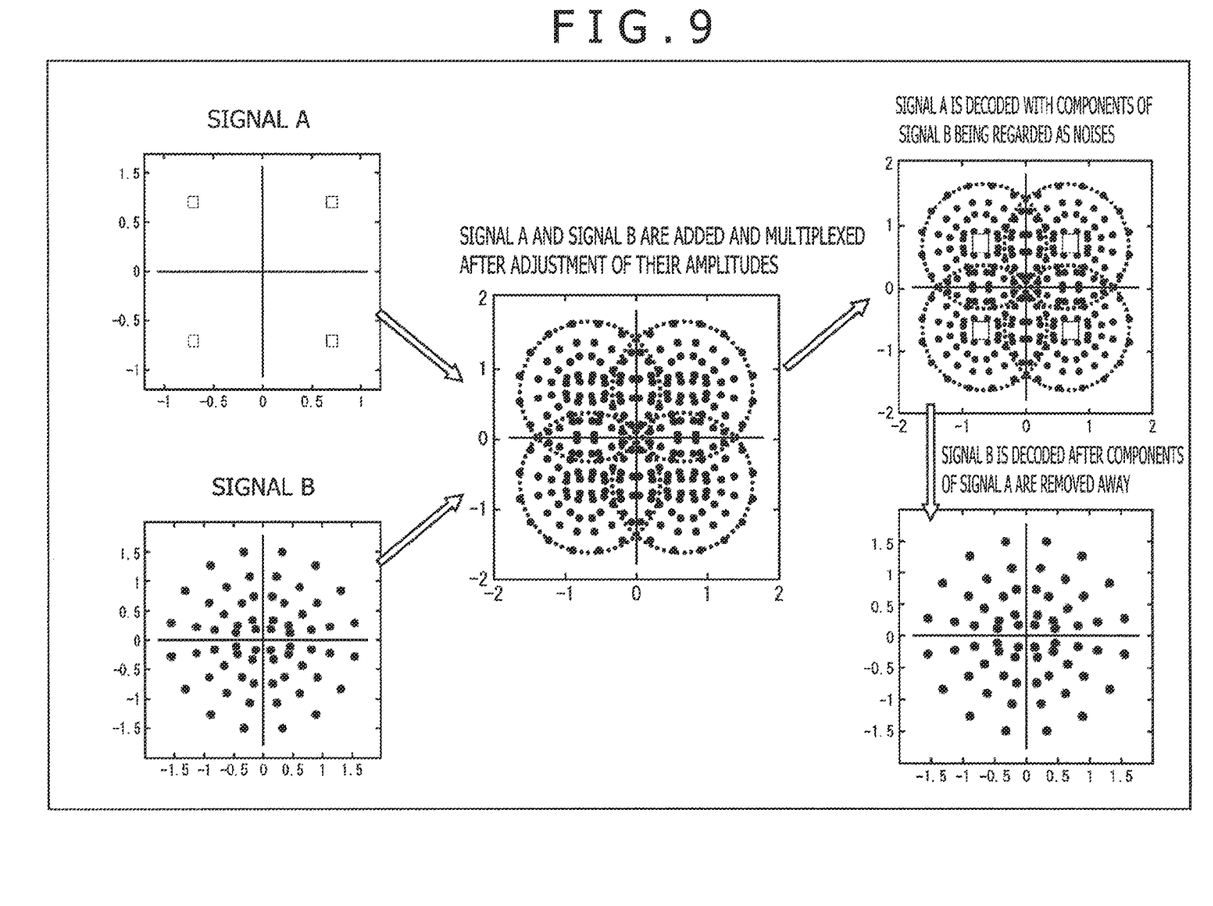
FIG. 9 is a diagram for explaining multiplexing and decoding thereof made in accordance with an LDM system.

FIG. 9 depicts an outline of multiplexing complying with the LDM system, and decoding for the multiplexing.

In the LDM system, at the time of the transmission, for example, a signal A obtained through the modulation complying with the QPSK system depicted in top left of the figure, and for example, a signal B obtained through the modulation complying with a 64 non-uniform constellation (64 NUC) depicted in bottom left of the figure are added to each other after the signal amplitudes of the signal A and the signal B are adjusted to be multiplexed as depicted at the center of the figure.

On the other hand, at the time of the reception, firstly, as depicted in upper right of the figure, components of the signal B obtained through the modulation complying with the 64NUM system as a second modulation system are regarded as the noises. In this case, the signal A obtained through the modulation complying with the QPSM system as a first modulation system is decoded. Next, as depicted in bottom right of the figure, after the components of the signal A decoded are removed away, the signal B obtained through the modulation complying with the 64NUM system as the second modulation system is decoded.

It should be noted that the result obtained through the modulation complying with the QPSK system after being coded with the predetermined LDPC code and interleaved may be used as the signal A. In addition, the result obtained through the modulation complying with the 64NUC system after being coded with the predetermined LDPC code which is the same as that for the signal A or different therefrom and interleaved may be used as the signal B.

When the signal A and the signal B are coded with the same LDPC code, the signal A and the signal B can be decoded by the common LDPC decoder. This also applies to the peripheral circuit(s) of the LDPC decoder.

Hereinafter, a description will be given with respect to a method of decoding the received signal (signal obtained through multiplexing) by the data processing apparatus 30. In this case, the received signal (signal obtained through multiplexing) is obtained by multiplexing the signal A obtained through the modulation complying with the QPSK system after being coded with the predetermined LDPC code, and interleaved, and the signal B obtained through the modulation complying with the 64NUC system after being coded with the same LDPC code, and interleaved by using the LDM system.

This decoding method is basically carried out for the components of the signal B of the received signal after the processing at the time of the reception described with reference to FIG. 8 is executed for the components of the signal A of the received signal.

That is to say, firstly, the received signal (signal obtained through multiplexing) as the processing object data 21 is inputted to the 360 bit demappers 22 with 4×360 bits as a unit. The 360 bit demappers 22 execute the parallel demapping processing by calculating the likelihood corresponding to the signal A for the received signal, and output in parallel the processing results to the bit deinterleaver 23.

The bit deinterleaver 23 executes the bit interleave reverse processing corresponding to the bit interleave processing for the signal A which is being executed on the transmission side for the outputs from the 360 bit demappers 22, and outputs in parallel the processing results to the barrel shifter 24.

The barrel shifter 24 executes the column twist reverse processing corresponding to the column twist processing for the signal A which is being executed on the transmission side for the outputs from the bit deinterleaver 23 which are inputted thereto in parallel. Then, the barrel shifter 24 outputs in parallel the processing results to the LDPC decoder 25.

The LDPC decoder 25 executes in parallel the LDPC code decoding processing for the signal A for the outputs from the barrel shifter 24, which are inputted thereto in parallel. Then, the LDPC decoder 25 outputs in parallel the processing results to the barrel shifter 31.

The barrel shifter 31 executes the same column twist processing as the column twist processing executed for the signal A on the transmission side for the outputs, from the LDPC decoder 25, which are inputted thereto in parallel. Then, the barrel shifter 31 outputs in parallel the processing results to the bit interleaver 23.

The bit interleaver 23 executes the same bit interleave processing as the bit interleave processing executed for the signal A on the transmission side for the outputs, from the barrel shifter 31, which are inputted thereto in parallel. Then, the bit interleaver 23 outputs in parallel the processing results to the 360 bit demappers 22.

The 360 bit demapper 22 executes the decoding processing for the hard decision for the outputs from the 360 bit demapper 22, which are inputted thereto in parallel. Then, the 360 bit demapper 22 executes the processing for carrying out the subtraction from the received signals after carrying out the same amplitude adjustment as that on the transmission side.

Next, the 360 bit demappers 22 execute the parallel demapping processing by calculating the likelihoods corresponding to the signal B by using that subtraction processing result. Then, the 360 bit demappers 22 output in parallel the processing results to the bit deinterleaver 23.

As far as the processing for the signal B of the received signals, similarly to the case of the processing for the signal A, the processing in the bit interleaver 23, and the processing in the barrel shifter 24 are executed is parallel to each other. In addition, the LDPC decoder 25 executes in parallel the LDPC code decoding processing for the signal B for the outputs, from the barrel shifter 24, which are inputted thereto in parallel. The LDPC decoder 25 outputs in parallel the processing results.

After that, the barrel shifter 31 executes the same column twist processing as the column twist processing executed for the signal B on the transmission side for the outputs from the LDPC decoder 25, which are inputted thereto in parallel. Then, the barrel shifter 31 outputs in parallel the processing results to the bit interleaver 23.

The bit interleaver 23 executes the same bit interleave processing as the bit interleave processing executed for the signal B on the transmission side for the outputs, from the barrel shifter 31, which are inputted thereto in parallel. Then, the bit interleaver 23 outputs in parallel the processing results to the 360 bit demappers 22.

The 360 bit demappers 22 execute the decoding processing for the hard decision for the outputs, from the 360 bit demapper 22, which are inputted thereto in parallel. Then, after the amplitude adjustment equal to that on the transmission side is carried out, the signal B is outputted.

By the way, although in the above description, the various kinds of parallel processing are executed with 360 bits as a unit, the parallel processing is by no means limited to the 360 bits and thus the parallel processing using a multiple or divide of the 360 bits may also be available.

In addition, even when the parallel numbers of the LDPC code with which the signal A and the signal B are coded are different from each other, it may be available that after the parallel number of the data processing apparatus 30 is coordinated with the larger parallel number, the processing for the signal A, and the processing for the signal B are communized.

In addition, it may also be available that instead of carrying out the hard decision in the 360 bit demappers 22 after the signal A is processed, such processing as to calculate the likelihood of the signal B with the likelihood obtained as the result of decoding the signal A as the prior information is executed in the 360 bit demappers 22.

Furthermore, it may be available that after the processing for the signal A, and the processing for the signal B are executed in a general way, such repetition decoding as to successively execute the processing for the signal A, and the processing for the signal B in an arbitrary order is carried out a plurality of times.

It may also be available that the number of times of repetition of the LDPC decode carried out within the respective pieces of LDPC decoding processing is the arbitrary numbers of times such as once, or more than once, and the number of times of decoding between the LDPC decoder and demapper in the outside is set as the arbitrary number of times such as once or more than once for the signal A and the signal B.

Furthermore, the data processing apparatus 30 can be used in the case where the received signal in which two or more or a plurality of signals is multiplexed in accordance with the LDPC system is decoded.

It should be noted that the embodiment of the present disclosure is by no means limited to the above-mentioned embodiment, and then various modified changes can be made without departing from the subject matter of the present disclosure.

The present disclosure can also adopt the following constitution.

(1)

A data processing apparatus in which data as an object of transmission is LDPC-coded on a transmission side, the resulting LDPC code is mapped to a symbol on a complex plane corresponding to a predetermined modulation system, a data stream representing the symbol to which the mapping is carried out is bit-interleaved with a predetermined bit group as a unit, and the bit-interleaved data stream transmitted in accordance with the predetermined modulation system is set as an object of processing, the data processing apparatus including:

a parallel demapping portion configured to obtain a second data stream by executing in parallel demapping processing corresponding to the mapping on the transmission side for a first data stream, as an object of processing, corresponding to the bit-interleaved data stream transmitted from the transmission side;

a bit interleave reverse processing portion configured to obtain a third data stream by executing in parallel bit interleave reverse processing corresponding to the bit interleave on the transmission side for the second data stream; and an LDPC decoding portion configured to decode the third data stream inputted in parallel with the bit group as the unit.

(2)

The data processing apparatus described in (1), further including a bit interleave processing portion configured to obtain a fourth data stream by executing in parallel the same bit interleave processing as that of the bit interleave on the transmission side for an output from the LDPC decoding portion, wherein the parallel demapping portion obtains a second data stream by executing in parallel a demapping processing corresponding to the mapping on the transmission side with the fourth data stream as well as an object of processing.

(3)

The data processing apparatus described in (1) or (2), wherein the predetermined modulation system is a 64K16QAM system, and the unit of the predetermined bit group is 360 bits.

(4)

A data processing method for use in a data processing apparatus in which data as an object of transmission is LDPC-coded on a transmission side, the resulting LDPC code is mapped to a symbol on a complex plane corresponding to a predetermined modulation system, a data stream representing the symbol to which the mapping is carries out is bit-interleaved with a predetermined bit group as a unit, and the bit-interleaved data stream transmitted in accordance with the predetermined modulation system is set as an object of processing, the data processing method including:

a parallel demapping step of obtaining a second data stream by executing in parallel demapping processing corresponding to the mapping on the transmission side for a first data stream, as an object of processing, corresponding to the bit-interleaved data stream transmitted from the transmission side;

a bit interleave reverse processing step of obtaining a third data stream by executing in parallel bit interleave reverse processing corresponding to the bit interleave on the transmission side for the second data stream; and an LDPC decoding step of decoding the third data stream inputted in parallel with the bit group as the unit, the parallel demapping step, the bit interleave processing step, and the LDPC decoding step being executed by the data processing apparatus.

(5)

A data processing apparatus in which a received signal obtained through multiplexing complying with an LDM (Layered Division Multiplexing) after a plurality of pieces of data as an object of transmission is LDPC-coded and bit interleaved with predetermined bit group as a unit on a transmission side is set as an object of processing, the data processing apparatus including:

a parallel demapping processing portion configured to obtain a second data stream by executing in parallel demapping processing for calculating each likelihood of data as an object of decoding, with data other than data as the object of decoding being regarded as a noise, for a first data stream, as an object of processing, corresponding to the received signal transmitted from the transmission side;

a bit interleave reverse processing portion configured to obtain a third data stream by executing in parallel bit interleave reverse processing corresponding to the bit interleave on the transmission side for the second data stream;

an LDPC decoding portion configured to decode the third data stream inputted in parallel with the bit group as the unit; and a bit interleave processing portion configured to obtain a fourth data steam by executing in parallel the same bit interleave processing as that of the bit interleave on the transmission side for an output from the LDPC decoding portion, wherein the parallel demapping portion obtains a second data stream by executing in parallel the demapping processing with the fourth data stream as well as an object of processing.

(6)

The data processing apparatus described in (5), wherein in the received signal, a result in which first data as an object of transmission is LDPC-coded on a transmission side, bit-interleaved with a predetermined bit group as a unit, and modulated in accordance with a QPSK system and a result in which second data as an object of transmission is LDPC-coded, bit-interleaved with a predetermined bit group as a unit, and modulated in accordance with a 64NUC system are multiplexed in accordance with an LDM system.

(7)

A data processing method for use in a data processing apparatus in which a received signal obtained through multiplexing complying with an LDM (Layered Division Multiplexing) after a plurality of pieces of data as an object of transmission is LDPC-coded and interleaved with a predetermined bit group as a unit on a transmission side is set as an object of processing, the data processing method including:

a parallel demapping processing step of obtaining a second data stream by executing in parallel demapping processing for calculating each likelihood of data as an object of decoding, with data other than data as the object of decoding being regarded as a noise, for a first data stream, as an object of processing, corresponding to the received signal transmitted from the transmission side;

a bit interleave reverse processing step of obtaining a third data stream by executing in parallel bit interleave reverse processing corresponding to the bit interleave on the transmission side for the second data stream;

an LDPC decoding step of decoding the third data stream inputted in parallel with the bit group as the unit; and a bit interleave processing step of obtaining a fourth data steam by executing in parallel the same bit interleave processing as that of the bit interleave on the transmission side for an output from the LDPC decoding step, the parallel demapping processing step, the bit interleave reverse processing step, the LDPC decoding step and the bit interleave processing step being executed by the data processing apparatus, wherein the parallel demapping step obtains a second data stream by executing in parallel the demapping processing with the fourth data stream as well as an object of processing.

REFERENCE SIGNS LIST

20 . . . Data processing apparatus, 21 . . . Object data, 22 . . . 360 bit demapper, 23 . . . Bit deinterleaver, 24 . . . Barrel shifter, 25 . . . LDPC decoder, 30 . . . Data processing apparatus, 31 . . . Barrel shifter, 32 . . . Bit deinterleave

The invention claimed is:

1. A data processing apparatus in which data as an object of transmission is low density parity check-coded on a transmission side, the resulting low density parity check code is mapped to a symbol on a complex plane corresponding to a predetermined modulation system, a data stream representing the symbol to which the mapping is carried out is bit-interleaved with a predetermined bit group as a unit, and the bit-interleaved data stream transmitted in accordance with the predetermined modulation system is set as an object of processing, the data processing apparatus comprising:
- a parallel demapping processing portion configured to obtain a second data stream by executing in parallel demapping processing corresponding to the mapping on the transmission side for a first data stream, as the object of processing, corresponding to the bit-interleaved data stream transmitted from the transmission side;
- a bit interleave reverse processing portion configured to obtain a third data stream by executing in parallel bit interleave reverse processing corresponding to a bit interleave on the transmission side for the second data stream;
- a barrel shifter configured to obtain a fourth data stream by performing in parallel column twist reverse processing on the third data stream; and
- a low density parity check decoding portion configured to decode the fourth data stream inputted in parallel with the predetermined bit group as the unit.

2. The data processing apparatus according to claim 1, further comprising:
- a second barrel shifter configured to obtain a fifth data stream by performing in parallel the same column twist processing on the transmission side for outputs of the low density parity check decoding portion; and
- a bit interleave processing portion configured to obtain a sixth data stream by executing in parallel the same bit interleave processing on the fifth data stream as that of the bit interleave on the transmission side,
- wherein the parallel demapping processing portion is further configured to obtain the second data stream by executing in parallel a demapping processing corresponding to the mapping on the transmission side with the sixth data stream as well as the object of processing.

3. The data processing apparatus according to claim 2,
wherein the predetermined modulation system is a 64K16 quadrature amplitude modulation system, and
the unit of the predetermined bit group is 360 bits.

4. A data processing method for use in a data processing apparatus in which data as an object of transmission is low density parity check-coded on a transmission side, the resulting low density parity check code is mapped to a symbol on a complex plane corresponding to a predetermined modulation system, a data stream representing the symbol to which the mapping is carried out is bit-interleaved with a predetermined bit group as a unit, and the bit-interleaved data stream transmitted in accordance with the predetermined modulation system is set as an object of processing, the data processing method comprising:
- obtaining, with a parallel demapping processing portion of the data processing apparatus, a second data stream by executing in parallel demapping processing corresponding to the mapping on the transmission side for a first data stream, as the object of processing, corresponding to the bit-interleaved data stream transmitted from the transmission side;
- obtaining, with a bit interleave reverse processing portion of the data processing apparatus, a third data stream by executing in parallel bit interleave reverse processing corresponding to the bit interleave on the transmission side for the second data stream;
- obtaining, with a barrel shifter of the data processing apparatus, a fourth data stream by performing column twist reverse processing on the third data stream; and
- decoding, with a low density parity check decoder of the data processing apparatus, the third data stream inputted in parallel with the predetermined bit group as the unit.

5. A data processing apparatus in which a received signal obtained through multiplexing complying with a Layered Division Multiplexing after a plurality of pieces of data as an object of transmission is low density parity check-coded and bit interleaved with a predetermined bit group as a unit on a transmission side is set as an object of processing, the data processing apparatus comprising:
- a parallel demapping processing portion configured to obtain a second data stream by executing in parallel mapping processing for calculating each likelihood of data as an object of decoding, with data other than data as the object of decoding being regarded as a noise, for a first data stream as the object of processing, corresponding to the received signal transmitted from the transmission side;
- a bit interleave reverse processing portion configured to obtain a third data stream by executing in parallel bit interleave reverse processing corresponding to the bit interleave on the transmission side for the second data stream;
- a first barrel shifter configured to obtain a fourth data stream by performing in parallel column twist reverse processing on the third data stream;
- a low density parity check decoding portion configured to decode the fourth data stream inputted in parallel with the predetermined bit group as the unit;
- a second barrel shifter configured to obtain a fifth data stream by performing in parallel the same column twist processing on the transmission side for outputs of the low density parity check decoding portion; and
- a bit interleave processing portion configured to obtain a sixth data steam by executing in parallel the same bit interleave processing on the fifth data stream as that of the bit interleave on the transmission side,
- wherein the parallel demapping processing portion is configured to obtain the second data stream by executing in parallel the demapping processing with the sixth data stream as well as the object of processing.

6. The data processing apparatus according to claim 5,
wherein in the received signal, a result in which first data as the object of transmission is low density parity check-coded on the transmission side, bit-interleaved with the predetermined bit group as the unit, and modulated in accordance with a quadri-phase shift keying system, and a result in which second data as the object of transmission is low density parity check-coded, bit-interleaved with the predetermined bit group as the unit, and modulated in accordance with a 64 non-uniform constellation system are multiplexed in accordance with a layered division multiplexing system.

7. A data processing method for use in a data processing apparatus in which a received signal obtained through multiplexing complying with a Layered Division Multiplexing after a plurality of pieces of data as an object of transmission is low density parity check-coded and bit interleaved in with a predetermined bit group as a unit on a transmission side is set as an object of processing, the data processing method comprising:

obtaining, with a parallel demapping processing portion of the data processing apparatus, a second data stream by executing in parallel demapping processing for calculating each likelihood of data as an object of decoding, with data other than data as the object of decoding being regarded as a noise, for a first data stream as the object of processing, corresponding to the received signal transmitted from the transmission side;

obtaining, with a bit interleave reverse processing portion of the data processing apparatus, a third data stream by executing in parallel bit interleave reverse processing corresponding to the bit interleave on the transmission side for the second data stream;

obtaining, with a first barrel shifter of the data processing apparatus, a fourth data stream by performing in parallel column twist reverse processing on the third data stream;

decoding, with a low density parity check decoding portion of the data processing apparatus, the fourth data stream inputted in parallel with the predetermined bit group as the unit;

obtaining, with a second barrel shifter of the data processing apparatus, a fifth data stream by performing in parallel the same column twist processing on the transmission side for outputs of the low density parity check decoding portion; and obtaining, with a bit interleave processing portion of the data processing apparatus, a sixth data steam by executing in parallel the same bit interleave processing on the fifth data stream as that of the bit interleave on the transmission side, wherein obtaining the second data stream further includes obtaining the second data stream by executing in parallel the demapping processing with the sixth data stream as well as the object of processing.

* * * * *